United States Patent
Rhee et al.

(10) Patent No.: US 9,172,425 B2
(45) Date of Patent: Oct. 27, 2015

(54) APPARATUS AND METHOD FOR ULTRA WIDEBAND COMMUNICATION USING DUAL BAND PASS FILTER

(71) Applicants: SAMSUNG ELECTRONICS CO., LTD., Suwon-si (KR); Tsinghua University, Beijing (CN)

(72) Inventors: Woogeun Rhee, Beijing (CN); Fei Chen, Beijing (CN); Jong Jin Kim, Hwaseong-si (KR); Dong Wook Kim, Seoul (KR); Zhihua Wang, Beijing (CN)

(73) Assignees: Samsung Electronics Co., Ltd., Suwon-si (KR); Tsinghua University, Beijing (CN)

( * ) Notice: Subject to any disclaimer, the term of this patent is extended or adjusted under 35 U.S.C. 154(b) by 0 days.

(21) Appl. No.: 13/966,462

(22) Filed: Aug. 14, 2013

(65) Prior Publication Data
US 2014/0050252 A1  Feb. 20, 2014

Related U.S. Application Data

(60) Provisional application No. 61/683,019, filed on Aug. 14, 2012.

(30) Foreign Application Priority Data

Mar. 12, 2013  (KR) .................. 10-2013-0026371

(51) Int. Cl.
*H04B 1/00*  (2006.01)
*H04B 17/00*  (2015.01)
(Continued)

(52) U.S. Cl.
CPC ................. *H04B 1/719* (2013.01); *H03D 3/26* (2013.01); *H04B 1/71637* (2013.01)

(58) Field of Classification Search
USPC .............. 455/63.1, 67.13, 130, 131, 142, 296
See application file for complete search history.

(56) References Cited

U.S. PATENT DOCUMENTS

| | | | |
|---|---|---|---|
| 4,523,324 A | 6/1985 | Marshall | |
| 5,034,695 A | 7/1991 | Owen | |

(Continued)

FOREIGN PATENT DOCUMENTS

| | | |
|---|---|---|
| JP | 2005-295051 | 10/2005 |
| JP | 2009-253824 | 10/2009 |

(Continued)

OTHER PUBLICATIONS

European Search Report issued Nov. 14, 2013 in counterpart European Patent Application No. 13180283.7-1852.
Chen, Fei, et al. "A 3.8 mW, 3.5—4GHz Regenerative FM-UWB Receiver with Enhanced Linearity by Utilizing a Wideband LNA and Dual Bandpass Filters." Radio-Frequency Integration Technology (RFIT), Nov. 2012, IEEE International Symposium pp. 150-153.

(Continued)

*Primary Examiner* — Quochien B Vuong
(74) *Attorney, Agent, or Firm* — NSIP Law

(57) ABSTRACT

An apparatus and method for ultra wideband (UWB) communication, using a dual band pass filter (BPF) is disclosed. The UWB communication apparatus may include a first BPF performing a first band pass filtering with respect to a UWB signal, a second BPF that has a center frequency differing from a center frequency of the first BPF, and performs a second band pass filtering with respect to the UWB signal, a first envelope detector that detects a size of a first signal filtered in the first BPF, a second envelope detector that detects a size of a second signal filtered in the second BPF, and a demodulator that demodulates a UWB signal, using the size of the first signal and the size of the second signal.

16 Claims, 8 Drawing Sheets

(51) Int. Cl.
*H04B 1/719* (2011.01)
*H04B 1/7163* (2011.01)
*H03D 3/26* (2006.01)

(56) References Cited

U.S. PATENT DOCUMENTS

| | | | |
|---|---|---|---|
| 5,715,529 | A | 2/1998 | Kianush et al. |
| 6,980,613 | B2 * | 12/2005 | Krivokapic .................... 375/346 |
| 6,985,540 | B2 * | 1/2006 | Nishikido ...................... 375/320 |
| 7,440,491 | B2 * | 10/2008 | Balakrishnan et al. ....... 375/148 |
| 7,643,811 | B2 * | 1/2010 | Reunamaki et al. .......... 455/63.1 |
| 8,098,707 | B2 * | 1/2012 | Harjani et al. ................. 375/130 |
| 2006/0170502 | A1 | 8/2006 | Cha et al. |

FOREIGN PATENT DOCUMENTS

| | | |
|---|---|---|
| KR | 1994-0001582 | 1/1994 |
| KR | 10-2006-0017811 | 2/2006 |
| KR | 10-0618389 | 9/2006 |
| KR | 10-0737811 | 7/2007 |
| KR | 10-2008-0090460 | 10/2008 |
| KR | 10-2010-0118469 | 11/2010 |
| WO | WO 2009/122365 A2 | 10/2009 |

OTHER PUBLICATIONS

Saputra, Nitz et al. "A Short-Range Low-Data-Rate Regenerative FM-UWB Receiver." IEEE Transactions on microwave theory and techniques, vol. 59, No. 4 (Apr. 2011) pp. 1131-1140.

* cited by examiner

300

400

APPARATUS AND METHOD FOR ULTRA WIDEBAND COMMUNICATION USING DUAL BAND PASS FILTER

CROSS-REFERENCE TO RELATED APPLICATION(S)

This application claims the benefit under 35 U.S.C. §119(e) of U.S. Provisional Application No. 61/683,019, filed on Aug. 14, 2012, in the U.S. Patent and Trademark Office, and the benefit under 35 U.S.C. §119(a) of Korean Patent Application No. 10-2013-0026371, filed on Mar. 12, 2013, in the Korean Intellectual Property Office, the entire disclosures of which are incorporated herein by reference for all purposes.

BACKGROUND

1. Field

The following description relates to an apparatus and method for ultra wideband (UWB) communication. More particularly, the description relates to an apparatus and method for frequency modulation (FM) demodulating of a UWB signal, using a dual band pass filter (BPF).

2. Description of Related Art

Ultra wideband (UWB) communication technology includes wireless communication technology that uses a high frequency band in a range of 3 gigahertz (GHz) to 10 GHz. The UWB communication technology may use a wide frequency band, and/or transmit data using an ultra high frequency (UHF).

Here, an apparatus for UWB communication, hereinafter referred to as a UWB communication apparatus, may be characterized by low power consumption in transmitting an impulse signal associated with a pulse width that is ultra short, through a frequency bandwidth of 500 megahertz (MHz). Such a UWB communication apparatus may readily be used for implementing a local area communication architecture, such as intelligent home network products, industrial products, military products, hearing aids, and the like, that require wireless communication with the characteristic of low power consumption.

In general, a UWB communication apparatus may demodulate a UWB signal which was previously modulated using an FM modulation scheme.

For example, a UWB communication apparatus may demodulate a UWB signal in a radio frequency (RF) domain, using an analog delay. Here, a delay cell of the RF domain may demodulate the UWB signal using a low power approach, such as by using an all pass filter (APF) that passes all bands. In this instance, the APF may demodulate the UWB signal, using a phase shift occurring when passing all bands.

SUMMARY

In one general aspect, there is provided an apparatus for ultra wideband (UWB) communication, including a first band pass filter (BPF) configured to filter a UWB signal to produce a first filtered signal, the first BPF having a first center frequency, a second BPF configured to filter the UWB signal to produce a second filtered signal, the second BPF having a second center frequency that differs from the first center frequency, and a demodulator configured to demodulate the UWB signal using a magnitude of the first filtered signal and a magnitude of the second filtered signal.

The demodulator may be configured to increase a signal to noise ratio (SNR) of the UWB signal through increasing a difference between the magnitude of the first filtered signal and the magnitude of the second filtered signal.

The apparatus may further include a low noise amplifier (LNA) configured to remove noise included in the UWB signal, and amplify the UWB signal from which the noise is removed.

The apparatus may be configured so that the magnitude of the first signal is configured to be at a maximum at the first center frequency, and the magnitude of the first signal decreases at frequencies that are increasingly distant from the first center frequency, and the magnitude of the second signal is configured to be at a maximum at the second center frequency, and the magnitude of the second signal decreases at frequencies that are increasingly distant from the second center frequency.

The apparatus may be configured so that the magnitude of the first signal is configured to be at a minimum at the second center frequency, and the magnitude of the second signal is configured to be at a minimum at the first center frequency.

The apparatus may be configured so that the demodulated UWB signal is produced with a greater signal to noise (SNR) ratio than a noisy UWB signal.

The first BPF may be configured to perform the first band pass filtering operation with respect to an edge signal associated with the first center frequency, and the second BPF may be configured to perform the second band pass filtering operation with respect to an edge signal associated with the second center frequency.

The first BPF and the second BPF may be configured to perform the first band pass filtering operation and the second band pass filtering operation, respectively, with respect to the UWB signal and configured to convert a frequency modulation (FM) signal to an amplitude modulation (AM) signal.

In another aspect, an apparatus for ultra wideband (UWB) communication includes band pass filters (BPFs) configured to perform band pass filtering operations based on differing center frequencies with respect to a UWB signal, envelope detectors configured to detect magnitudes of filtered signals on which the band pass filtering operations are performed, and a demodulator configured to demodulate the UWB signal, using differences detected between the filtered signals.

The demodulator may be configured to increase a signal to noise ratio (SNR) of the UWB signal through increasing a magnitude difference between the UWB signals detected.

The apparatus may further include a low noise amplifier (LNA) configured to remove noise included in the UWB signal, and amplify the UWB signal from which the noise is removed.

The demodulator may be configured to calculate a difference between the UWB signals detected, using at least one of a subtractor or an adder.

In yet another aspect, a method for ultra wideband (UWB) communication includes filtering a UWB signal to produce a first filtered signal, using a first band pass filter (BPF), the first BPF having a first center frequency, filtering the UWB signal to produce a second filtered signal, using a second BPF, the second BPF having a second center frequency that differs from the first center frequency, and demodulating the UWB signal, using the magnitude of the first filtered signal and the magnitude of the second filtered signal.

The demodulating may include increasing a signal to noise ratio (SNR) of the UWB signal through increasing a magnitude difference between the first signal and the second signal.

The method may further include removing noise included in the UWB signal, and amplifying a signal from which the noise is removed.

The first filtering may include performing the first filtering with respect to an edge signal associated with a center frequency of the first BPF, and the second filtering may include performing the second filtering with respect to an edge signal associated with a center frequency of the second BPF.

The low noise amplifier (LNA) may be configured to receive a noisy UWB signal, including signal information and noise information, and process the noisy UWB signal to produce a processed UWB signal, wherein the processed UWB signal comprises amplified signal information and reduced noise information.

The apparatus may further include a first envelope detector configured to detect a magnitude of the first filtered signal and a second envelope detector configured to detect a magnitude of the second filtered signal.

The method may further include detecting a magnitude of the first filtered signal, and detecting a magnitude of the second filtered signal.

Other features and aspects will be apparent from the following detailed description, the drawings, and the claims.

Figure 1:
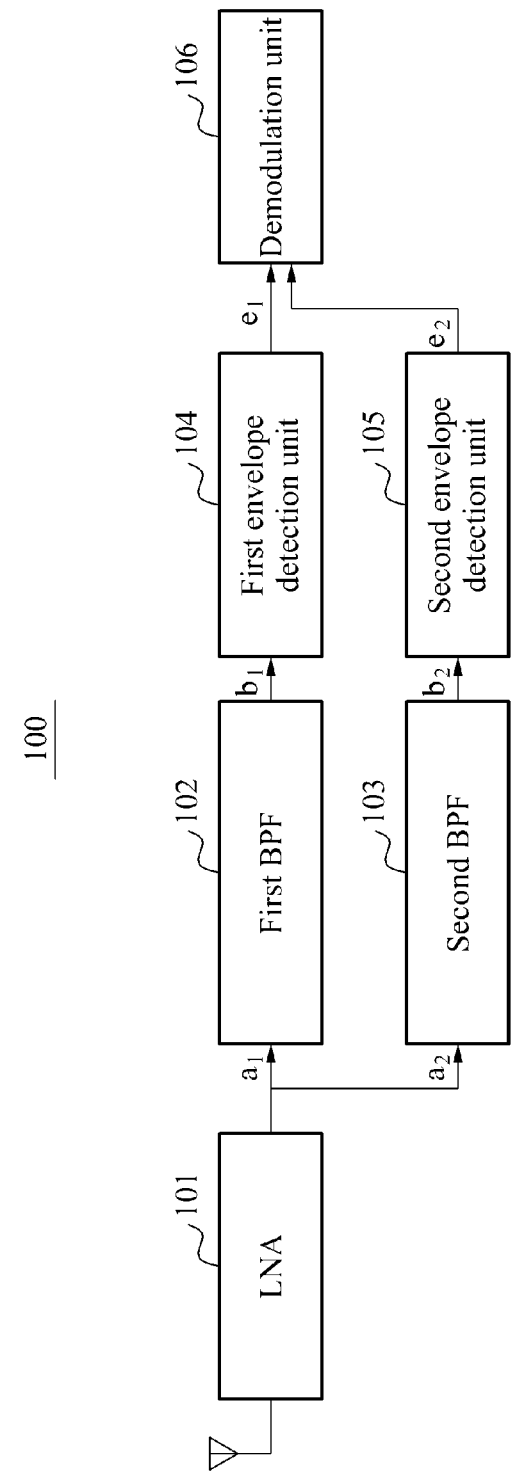
FIG. 1 is a diagram illustrating an example of a high-level configuration of an ultra wideband (UWB) communication apparatus.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. Also, descriptions of functions and constructions that are well known to one of ordinary skill in the art may be omitted for increased clarity and conciseness.

Throughout the drawings and the detailed description, the same reference numerals refer to the same elements. The drawings may not be to scale, and the relative size, proportions, and depiction of elements in the drawings may be exaggerated for clarity, illustration, and convenience.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates an example of a high-level configuration of an ultra wideband (UWB) communication apparatus 100.

Referring to FIG. 1, the UWB communication apparatus 100 may include a low noise amplifier (LNA) 101, a first band pass filter (BPF) 102, a second BPF 103, a first envelope detection unit 104, a second envelope detection unit 105, and a demodulation unit 106.

The LNA 101 may remove noise included in a UWB signal, and amplify the UWB signal from which the noise is removed, based on a predetermined amplification value. By performing these functions, the LNA 101 simultaneously strengthens the signal that is of interest while removing extraneous noise from the signal.

In an example embodiment, the LNA 101 removes noise included in a UWB signal, and amplifies the UWB signal from which the noise is removed, using a wideband LNA. In order to perform this functionality, the LNA 101 boosts the desired signal power, but the LNA 101 minimizes added noise and distortion to help preserve the UWB signal as much as possible.

For example, in one embodiment, the UWB signal includes a carrier signal which has been modulated using a frequency shift keying (FSK) scheme to a different center frequency. Such an approach provides for frequency modulation (FM)-UWB communication. In this example, the UWB signal includes a carrier modulated to a first center frequency $f_{c1}$ and a carrier modulated to a second center frequency $f_{c2}$. As such, when this example wideband LNA approach is used, performance deterioration of the UWB communication apparatus 100 that occurs during a demodulation due to narrowband interference may be reduced or removed.

After the LNA 101 acts on the UWB signal, the BPFs perform band pass filtering. For example, the first BPF 102 performs a first band pass filtering with respect to a UWB signal and the second BPF 103 performs a second band pass filtering with respect to a UWB signal. In such an example, the second BPF 103 may have a center frequency differing from a center frequency of the first BPF 102. If the second BPF 103 has a center frequency that differs from a center frequency of the first BPF 103, the BPFs may each derive different information from the original UWB signal, which will be described in greater detail below.

For example, the first BPF 102 may perform a first band pass filtering, using a narrowband BPF with the first center frequency $f_{c1}$. Similarly, the second BPF 103 may perform a second band pass filtering, using a narrowband BPF with the second center frequency $f_{c2}$. For example, a first center frequency from among a frequency band in a range of 3 gigahertz (GHz) to 10 GHz may be preset to be 4.1 GHz, and a second center frequency may be preset to be 3.4 GHz, and the like. However, these example center frequencies are merely illustrative, and are not meant to be limiting. As noted previously, having different center frequencies may assist in providing the functionality of the apparatus, but it is not required of embodiments that the center frequencies be different.

In an example, the UWB signal includes a first signal and a second signal that are filtered out by the first BPF 102 and the second BPF 103. The center frequencies are chosen so as to help the first BPF 102 and the second BPF 103 extract the constituent signals from the UWB signal. In this example, the size of the first signal filtered in the first BPF 102 reaches a maximum in the first center frequency, and the more distant a frequency from the first center frequency, the smaller the size of the first signal. A size of a second signal filtered in the second BPF 103 reaches a maximum in the second center frequency, and the more distant a frequency from the second center frequency, the smaller the size of the second signal. In addition, the first and second center frequencies may be chosen so the size of the first signal reaches a minimum in the second center frequency, and the size of the second signal reaches a minimum in the first center frequency.

As such, the first BPF 102 and the second BPF 103 may perform the first band pass filtering and the second band pass filtering with respect to the UWB signal, respectively, to convert an FM signal to an amplitude modulation (AM) signal.

The first envelope detection unit 104 may detect the size of the first signal filtered through the first BPF 102. Also, the second envelope detection unit 105 may detect the size of the second signal filtered through the second BPF 103. In particular, the first envelope detection unit 104 may detect an AM voltage value of the first signal during an interval of time as the first signal and the second signal are converted to the AM signal, respectively. Similarly, the second envelope detection unit 105 may detect an AM voltage value of the second signal during an interval of time.

The demodulation unit 106 may demodulate a UWB modulation signal, using the size of the first signal and the size of the second signal. Here, the demodulation unit 106 may increase a signal to noise ratio (SNR) through increasing a difference between the size of the first signal and the size of the second signal. The demodulation unit 106 is able to increase the SNR by increasing the difference between the size of the first signal and the size of the second signal because the first signal and the second signal each provide enhanced information about of a part of the frequency spectrum carried by the overall UWB modulation signal, and thus it is possible to establish the attributes of the parts of the overall UWB modulation signal represented by the first signal and the second signal.

For example, the demodulation unit 106 may calculate the difference between the size of the first signal and the size of the second signal, using an adder or a subtractor. Here, the difference between the size of the first signal and the size of the second signal increases as a band pass filtering is performed with respect to a UWB signal, using two BPFs as discussed above. The difference increases because each BPF provides a signal that focuses on a separate portion of the UWB modulation signal, especially if the first center frequency and second center frequency are selected in a manner so as to maximize the strength of components of the UWB modulation signal at the two selected center frequencies, as discussed above.

Therefore, the demodulation unit 106 may more clearly distinguish and demodulate a portion of the UWB signal corresponding to the first center frequency from among UWB signals received during a single period of time, and a portion of the UWB signal corresponding to the second center frequency during that period of time.

In particular, the UWB communication apparatus 100 may facilitate FM-AM conversion by achieving a sufficient SNR, such as by using two BPFs in a simple structure as discussed above, without the need for a high-Q BPF. Because of this different approach, some embodiments of the UWB communication apparatus 100 demodulate a UWB signal with lower power requirements.

Figure 2:
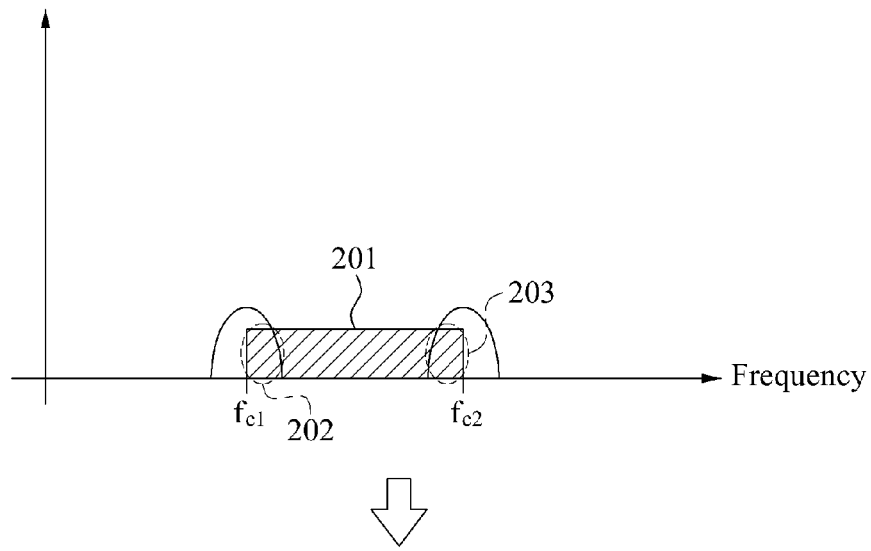
FIG. 2 is a diagram illustrating an example of an operation of enhancing a frequency modulation-amplitude modulation (FM-AM) conversion linearity, using two band pass filters (BPFs) in the UWB communication apparatus of FIG. 1.
Figure 2:
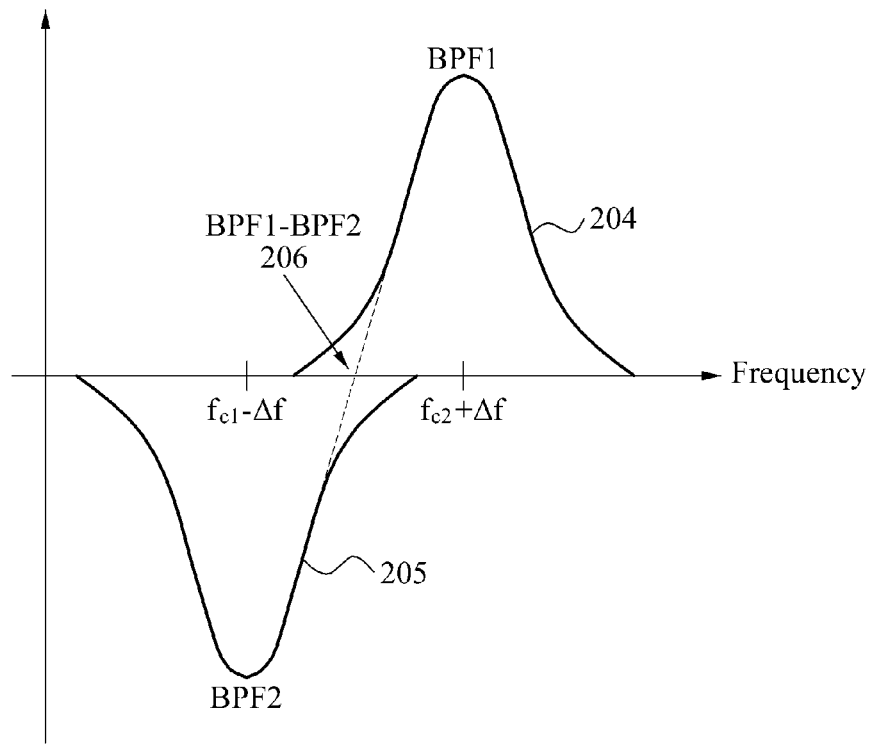

FIG. 2 is a diagram illustrating an example of an operation of enhancing an FM-AM conversion linearity, using two BPFs in the UWB communication apparatus of FIG. 1.

Referring to FIG. 2, the first BPF 102 may perform a first band pass filtering with respect to an edge signal 202 associated with the first center frequency $f_{c1}$. The second BPF 103 may perform a second band pass filtering with respect to an edge signal 203 associated with the second center frequency $f_{c2}$.

For example, the UWB communication apparatus 100 may demodulate a UWB signal by sweeping a UWB signal during a predetermined period of sweeping when a UWB signal 201 which is modulated based on respective carriers of the first center frequency $f_{c1}$ and the second center frequency $f_{c2}$ is received. Here, the UWB communication apparatus 100 may perform multiple sweepings to demodulate a UWB signal by setting different periods for sweeping.

For example, the first BPF 102 may perform a first band pass filtering with respect to the edge signal 202 associated with the first center frequency $f_{c1}$, through setting the period of sweeping to be brief during a first sweeping. In particular, the first BPF 102 may perform the first band pass filtering with respect to the edge signal 202 corresponding to a start area of the period of sweeping.

The second BPF 103 may perform a second band pass filtering with respect to the edge signal 203 corresponding to a final area of the period of sweeping during a second sweeping, through setting the period of sweeping to be slower than a duration of the first sweeping. As such, the UWB signal amplified in the LNA 101 may pass the first BPF 102 during the first sweeping, and then pass the second BPF 103 during the second sweeping.

A spectrum density of a first signal 204 corresponding to the edge signal 202 filtered in the first BPF 102 may be at a maximum in the first center frequency or in a frequency adjacent to the first center frequency, and may be at a minimum in the second center frequency or in a frequency adjacent to the second frequency.

Similarly, a spectrum density of a second signal 205 corresponding to the edge signal 203 filtered in the second BPF 103 may be at a maximum in the second center frequency or in a frequency adjacent to the second center frequency, and may be at a minimum in the first center frequency or in a frequency adjacent to the first center frequency.

Furthermore, an SNR may be enhanced through a difference BPF1–BFP2 206 between the spectrum density of the first signal 204 and the spectrum density of the second signal 205 being increased. In particular, an FM-AM conversion linearity may be enhanced by using the difference information.

Although FIG. 2 describes that a first BPF may perform a filtering with respect to an edge signal associated with a first center frequency, and a second BPF may perform a filtering with respect to an edge signal associated with a second center frequency, the descriptions in the foregoing are only examples of the types of filtering that may be performed by the BPFs.

In particular, the first BPF may perform a first band pass filtering in any frequency area corresponding to a period of sweeping during a first sweeping, not necessarily with respect to the edge signal. Similarly, the second BPF may perform a second band pass filtering in any frequency area corresponding to a period of sweeping during a second sweeping.

Figure 3:
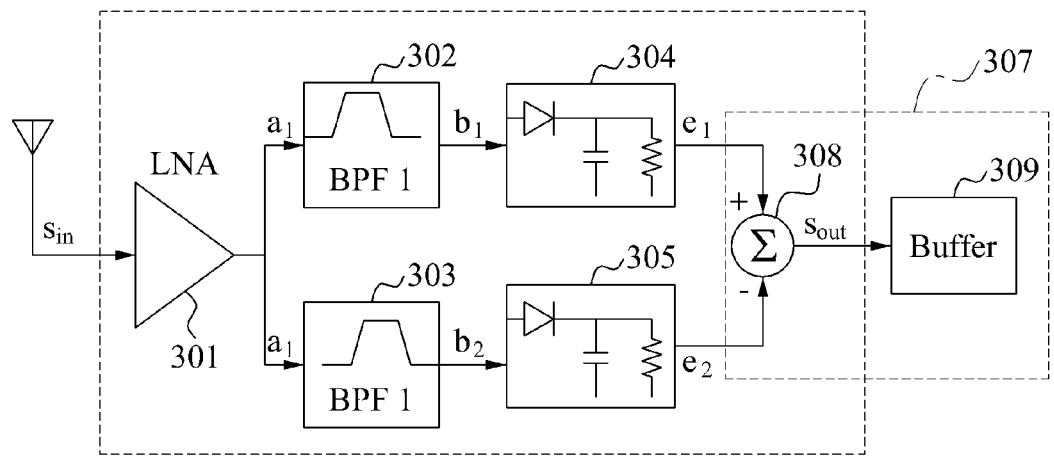
FIG. 3 is a diagram illustrating an example of a high-level circuit structure diagram of a UWB communication apparatus.

FIG. 3 is a diagram illustrating an example of a circuit structure overview of a UWB communication apparatus 300.

Referring to FIG. 3, the UWB communication apparatus 300 may include an LNA 301, a BPF1 302, a BPF2 303, a first envelope detection unit 304, a second envelope detection unit 305, and a demodulation unit 306.

A configuration element of the UWB communication apparatus 300 of FIG. 3 may be substantially identical, to a configuration element of the UWB communication apparatus 100 of FIG. 1 and thus, repeated descriptions will be omitted for conciseness. However, while FIG. 3 includes elements that may be substantially identical to FIG. 1 in certain embodiments, FIG. 3 and FIG. 1 are not identical. Hence, embodiments may have different or additional elements based on FIG. 1 that are not present in FIG. 3 and vice versa.

The LNA 301 may remove noise included in a UWB signal $S_{in}$, and amplify the UWB signal $S_i$, from which the noise is removed based on a predetermined amplification value. The LNA 301 may use a single ended to differential converter that outputs two signals through a single signal being inputted.

For example, the LNA 301 may remove noise included in a UWB signal, using a wideband LNA. The LNA 301 may amplify the UWB signal from which the noise is removed, and output the amplified signals $a_1$ and $a_2$ to the BPF1 302 and the BPF2 303, respectively.

The BPF1 302 may perform a first band pass filtering with respect to the UWB signal $a_1$ inputted from the LNA 301. The BPF1 302 is associated with a center frequency.

The BPF2 303 may perform a second band pass filtering with respect to the UWB signal $a_2$ inputted from the LNA 301. Here, the second BPF 303 may have a center frequency differing from the center frequency of the BPF1 302.

For example, the BPF1 302 may have a first center frequency of 4.1 GHz from among a frequency band in a range of 3 GHz to 10 GHz. The BPF2 303 may have a second center frequency of 3.4 GHz from among a frequency band in a range of 3 GHz to 10 GHz, differing from a frequency corresponding to the first center frequency.

In an example embodiment, a UWB signal $b_1$ on which a first band pass filtering is performed is converted from an FM signal to an AM signal. Similarly, a UWB signal $b_2$ on which a second band pass filtering is performed is converted from an FM signal to an AM signal.

The first envelope detection unit 304 may detect a size $e_1$ of the first signal $b_1$ filtered through the BPF1 302. The second envelope detection unit 305 may detect a size $e_2$ of the second signal $b_2$ filtered through the BPF2 303.

In an example embodiment, the size $e_1$ of the first signal detected in the first envelope detection unit 304 includes an AM voltage value of the first signal. The size $e_2$ of the second signal detected in the second envelope detection unit 305 includes an AM voltage value of the second signal.

As an example, the first envelope detection unit 304 may detect the AM voltage value $e_1$ of the first signal, using a diode, a capacitor, and a resistor. The second envelope detection unit 305 may detect the AM voltage value $e_2$ of the second signal, using a diode, a capacitor, and a resistor. However, some example architectures for first envelope detection unit 304 and second envelope detection unit 305 use additional electronic components or omit electronic components.

The demodulation unit 306 may demodulate a UWB modulation signal, using the size of the first signal and the size of the second signal. Here, the demodulation unit 306 may increase an SNR by increasing a difference between the size of the first signal and the size of the second signal.

The demodulation unit 306 may include a calculation unit 307 and a buffer 309.

For example, the calculation unit 307 may calculate a difference "$e_1-e_2$" between a size $e_1$ of the first signal and a size $e_2$ of the second signal, using a subtractor. Alternatively, the calculation unit 307 may calculate the difference between the size of the first signal and the size of the second signal, using an adder.

The buffer 309 may temporarily store a UWB signal $S_{out}$ demodulated based on the difference, and then output the UWB signal $S_{out}$. For example, a demodulated signal may refer to a digital signal, and a first UWB signal corresponding to a first center frequency may be demodulated to "1", and a second UWB signal corresponding to a second center frequency may be demodulated to "0". The buffer 309 may temporarily store either "1" or "0" until all UWB signals $S_{in}$ inputted to the LNA 301 are demodulated. In this instance, the buffer 309 may output a demodulated UWB signal $S_{out}$ when the demodulation is completed that includes the demodulated data.

Figure 4:
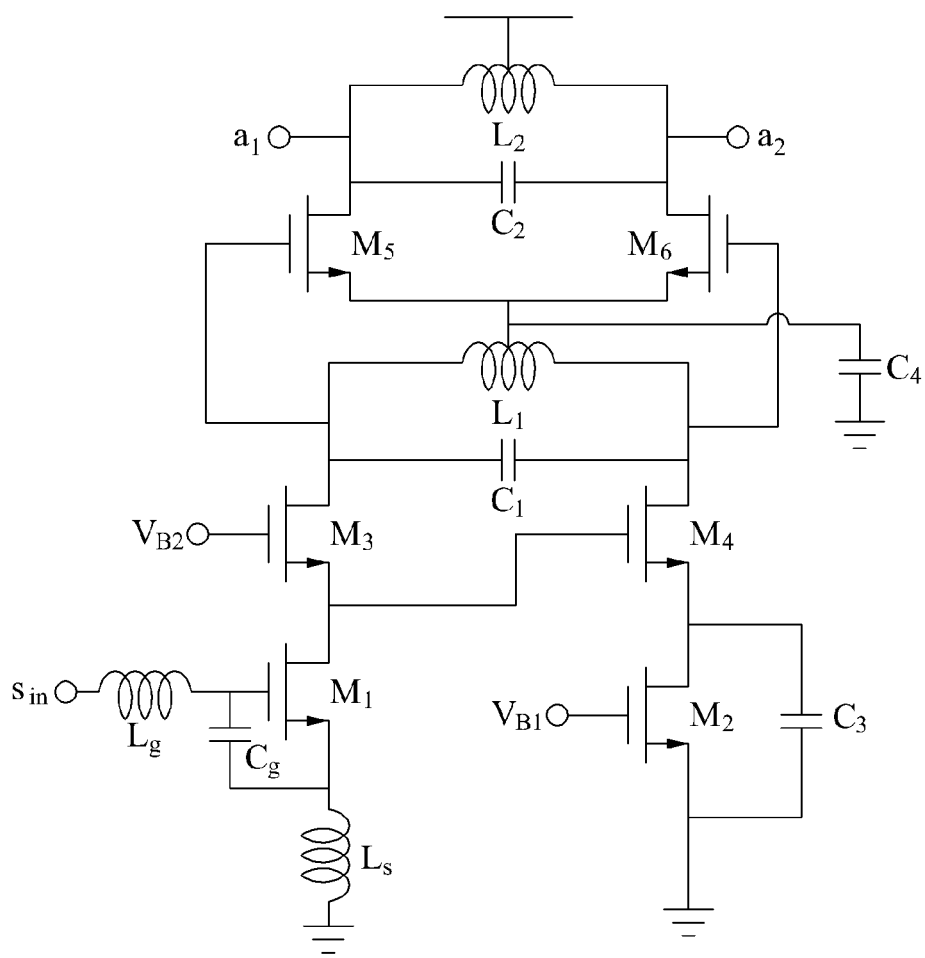
FIG. 4 is a diagram illustrating an example of a detailed circuit diagram of a low noise amplifier (LNA) of FIG. 1.

FIG. 4 is a diagram illustrating an example of a detailed circuit diagram of an LNA 400 illustrated in FIG. 1.

Referring to FIG. 4, the LNA 400 may remove noise from a UWB signal $S_{in}$, using a transistor $M_1$, an inductor $L_g$, $L_s$, and a capacitor $C_g$. For example, the UWB signal $S_{in}$ may include a carrier demodulated to a first center frequency $f_{c1}$, and a carrier demodulated to a second center frequency $f_{c2}$.

Here, the LNA 400 may resonate a UWB signal, from which noise is removed, in a first center frequency, using a transistor $M_3$, $M_4$, an inductor $L_1$, and a capacitor $C_1$ when a single ended to differential conversion is used. The UWB signal from which the noise is removed may be amplified in the first center frequency.

Similarly, the LNA 400 may resonate a UWB signal, from which noise is removed, in a second center frequency, using a transistor $M_5$, $M_6$, an inductor $L_2$, and a capacitor $C_2$. The UWB signal from which the noise is removed may be amplified in the second center frequency.

The LNA 400 may output UWB signals $a_1$ and $a_2$ amplified in the first center frequency and the second center frequency to a first BPF and a second BPF, respectively.

Although FIGS. 3 and 4 describe that an LNA uses a single ended to differential conversion, the descriptions are only exemplary. The LNA may also use a differential ended to single conversion and a differential ended to differential conversion.

Figure 5:
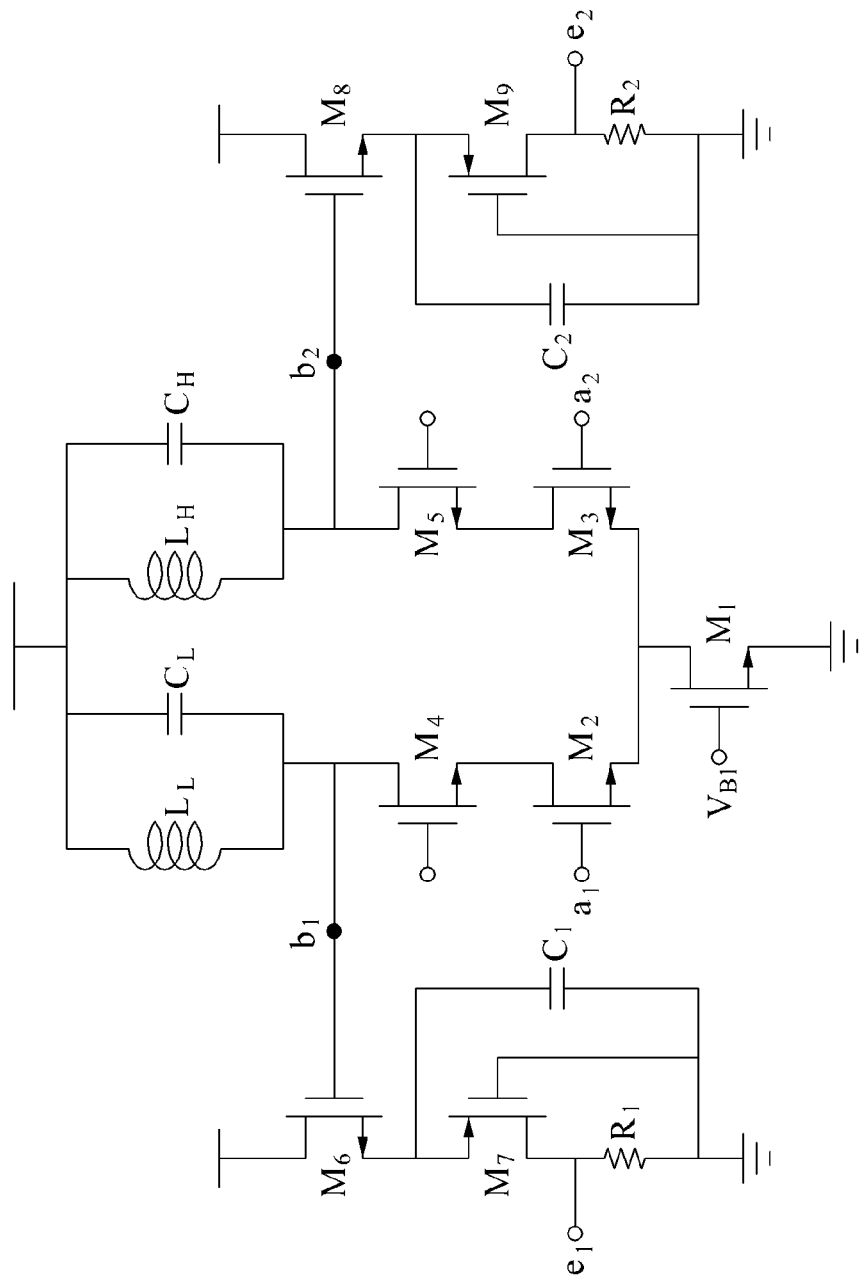
FIG. 5 is a diagram illustrating an example of a detailed circuit diagram of a first and a second BPF, and a first and a second envelope detection unit of FIG. 1.

FIG. 5 is a diagram illustrating an example of a detailed circuit diagram of first and second BPFs and first and second envelope detection units illustrated in FIG. 1.

Referring to FIG. 5, UWB signals $a_1$ and $a_2$ amplified in an LNA may be inputted via transistors $M_2$ and $M_3$.

The first BPF may perform a first band pass filtering with respect to the amplified signal $a_1$, using a capacitor $C_L$ and an inductor $L_L$.

The second BPF may perform a second band pass filtering with respect to the amplified signal $a_2$, using a capacitor $C_H$ and an inductor $L_H$. Here, the first BPF may have a first center frequency, and the second BPF may have a second center frequency.

The first envelope detection unit may receive an input of a first signal $b_1$ on which a first band pass filtering is performed via a transistor $M_6$. The first envelope detection unit may detect a size $e_1$ of the first signal $b_1$, using the transistor $M_6$ and a capacitor $C_1$. In particular, an envelope of the first signal may be detected. Here, the envelope of the first signal may be amplified, using a transistor $M_7$ and resistance $R_1$.

In an analogous manner, the second envelope detection unit may receive an input of a second signal $b_2$ on which a second band pass filtering is performed via a transistor $M_8$. The second envelope detection unit may detect a size $e_2$ of the second signal $b_2$, using the transistor $M_8$ and a capacitor $C_2$. In particular, an envelope of the second signal may be detected.

Here, the envelope of the second signal may be amplified, using a transistor $M_9$ and resistance $R_2$.

Figure 6:
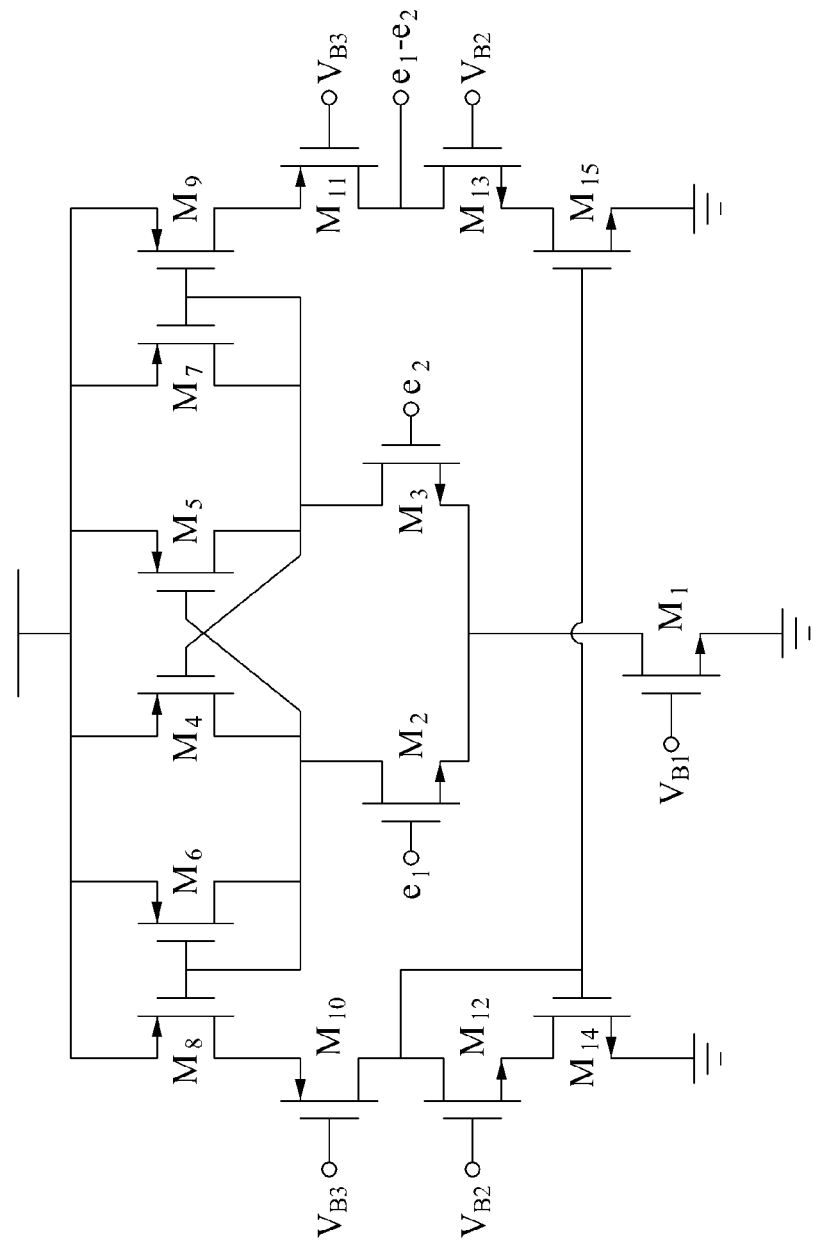
FIG. 6 is a diagram illustrating an example of a detailed circuit diagram of a subtractor.

FIG. 6 illustrates an example of a detailed circuit diagram of a subtractor.

Referring to the example of FIG. 6, a signal $e_1$ detected from a first envelope detection unit is inputted via a transistor $M_2$. A signal $e_2$ detected from a second envelope detection unit is inputted via a transistor $M_3$.

The subtractor may subtract the signal $e_2$ from the signal $e_1$, using the plurality of transistors, and output a difference "$e_1 - e_2$" between the two signals. Here, detailed descriptions will be omitted because an operation of subtracting two signals using a plurality of transistors is well known to one of ordinary skill in the art, and hence need not be further disclosed.

Thus far, embodiments that perform an operation of FM demodulating an FM modulated UWB signal for FM-UWB communication, using a plurality of BPFs, in the UWB communication apparatus has been discussed with reference to FIGS. 1 through 6.

Although FIGS. 1 through 6 describe an operation in which a UWB communication apparatus demodulates a UWB signal, using two BPFs, the descriptions are only exemplary and are not limited thereby. For example, the UWB communication apparatus may demodulate a UWB signal using at least three narrowband BPFs. Additionally, there is no specific limit on the number of narrowband BPFs to include in an embodiment.

In this instance, when the at least three narrowband BPFs are used, a plurality of filters may have center frequencies differing from one another. In particular, the UWB signal may include a carrier modulated into the center frequencies differing from one another. By using this approach, which is a generalized version of the approach taken with respect to FIGS. 1-6 in which two BPFs are used, it is possible for the multiple narrowband BFs to cooperate to demodulate the UWB signal.

The UWB communication apparatus may also, alternatively, demodulate a UWB signal, using a single narrowband BPF. For example, the UWB communication apparatus may demodulate a UWB signal, using a high-Q narrowband BPF.

The operation of a UWB communication apparatus including a plurality of BPFs and a plurality of envelope detection units will be described with reference to FIG. 7.

Figure 7:
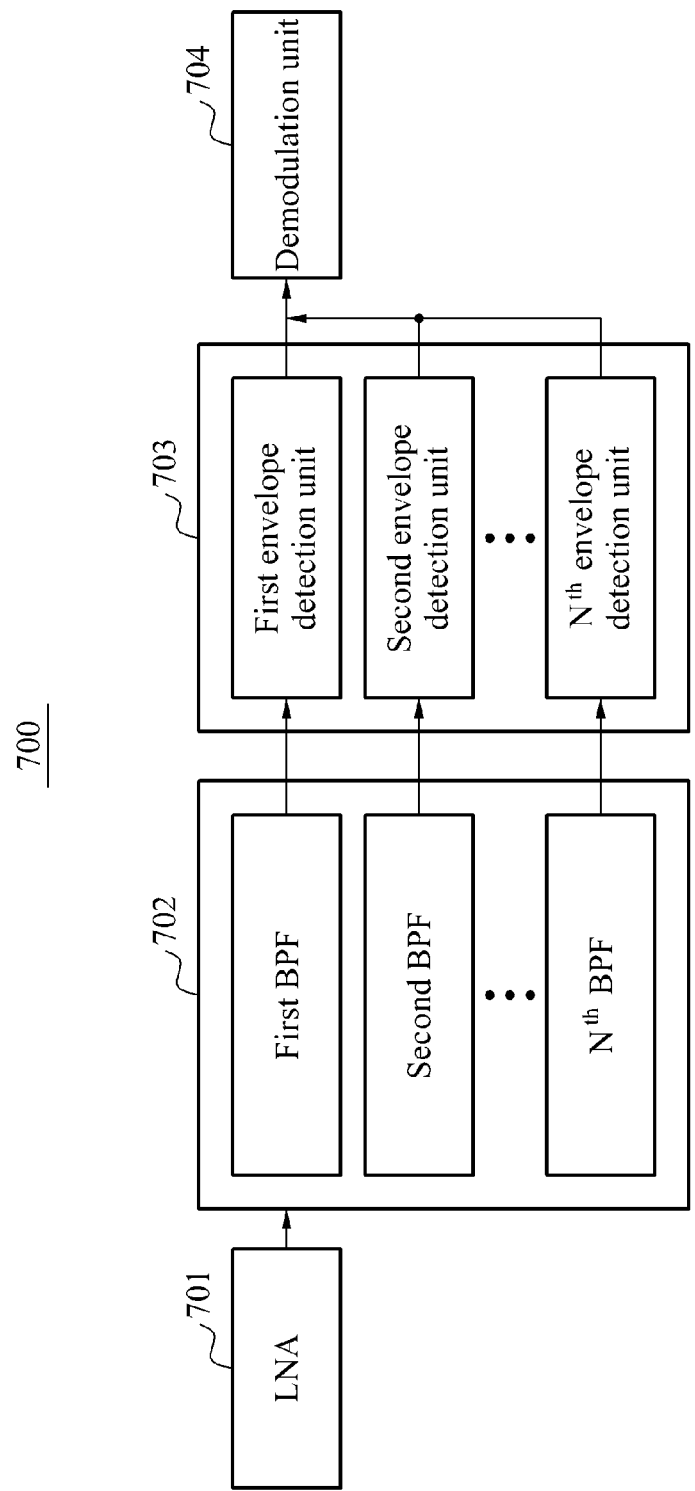
FIG. 7 is a diagram illustrating an example of a detailed configuration of another UWB communication apparatus.

FIG. 7 illustrates an example of a detailed configuration of a UWB communication apparatus 700.

Referring to FIG. 7, the UWB communication apparatus 700 may include an LNA 701, a plurality of BPFs 702, a plurality of envelope detection units 703, and a demodulation unit 704.

The UWB communication apparatus 700 of FIG. 7 may be similar to an architecture of the UWB communication apparatus 100 of FIG. 1. However, the UWB communication apparatus 700 of FIG. 7 includes at least three BPFs and envelope detection units, while only two of each of these elements appears in the UWB communication apparatus 100 of FIG. 1. Accordingly, repeated descriptions of those provided with reference to FIG. 1 will be omitted for conciseness and case of description.

The plurality of BPFs 702 may include a number, N, of BPFs having center frequencies differing from one another. In particular, the plurality of BPFs 702 may include the N number of BPFs having an N number of different center frequencies.

For example, a first BPF may have a first center frequency, and a second BPF may have a second center frequency. In an analogous manner, a third BPF through an $N^{th}$ BPF may have a third center frequency through an $N^{th}$ center frequency, respectively. Here, a UWB signal may include a carrier modulated in the first through the $N^{th}$ center frequencies, respectively.

The first BPF may perform a first band pass filtering with respect to a UWB signal, based on the first center frequency, during a first sweeping. In an analogous manner, the second through the $N^{th}$ BPFs may perform a second band pass filtering through an $N^{th}$ band pass filtering with respect to the UWB signal, based on the second center frequency through the $N^{th}$ center frequency, respectively.

The plurality of envelope detection units 703 may detect a size of a first signal through an $N^{th}$ signal on which the first band pass filtering through the $N^{th}$ band pass filtering are performed, respectively.

Here, the plurality of envelope detection units 703 may include a first envelope detection unit through an $N^{th}$ envelope detection unit. The first envelope detection unit may detect a size of the first signal filtered in the first BPF. Similarly, the second envelope detection unit through the $N^{th}$ envelope detection unit may detect a size of the second signal through the $N^{th}$ signal filtered in the second BPF through the $N^{th}$ BPF, respectively.

The demodulation unit 704 may demodulate a UWB signal by calculating a difference between the sizes of the plurality of signals detected from the plurality of envelope detection units 703.

For example, the demodulation unit 704 may subtract or add the size of the first signal through the size of the $N^{th}$ signal detected from the plurality of envelope detection units 703, using a subtractor or an adder. The demodulation unit 704 may increase an SNR through increasing the difference between the sizes of the N number of signals through such subtracting or adding. As such, the UWB communication apparatus 700 may demodulate a UWB signal in a low power as the SNR increases, using the plurality of BPFs, since if the SNR is greater, less power is needed to communicate the information carried by the UWB signal.

Figure 8:
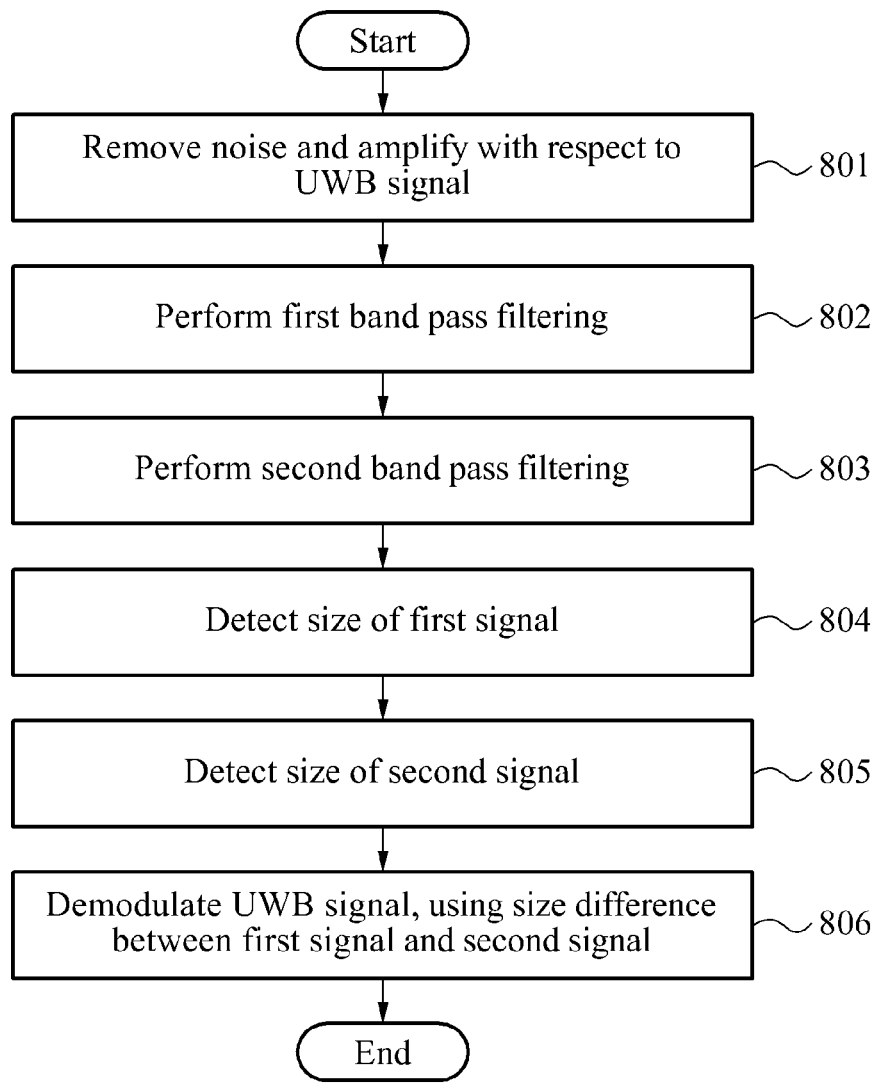
FIG. 8 is a flowchart illustrating an example of a method of demodulating a UWB signal in a UWB communication apparatus.

FIG. 8 is a flowchart illustrating an example of an operation of demodulating a UWB signal in a UWB communication apparatus.

In FIG. 8, a UWB communication method that demodulates a UWB signal may be conducted by the UWB communication apparatus of FIG. 1.

In 801, the UWB communication apparatus may remove noise with respect to a UWB signal, using an LNA. The UWB communication apparatus may amplify the UWB signal from which the noise is removed. Here, the LNA may include a wideband LNA.

For example, the UWB communication apparatus may amplify a UWB signal as the UWB signal is resonated in a first center frequency when a first BPF having a first center frequency and a second BPF having a second center frequency are used. The UWB communication apparatus may amplify a UWB signal as the UWB signal is resonated in the second center frequency. Here, the first BPF and the second BPF may include narrowband BPFs, respectively.

In 802, the UWB communication apparatus may perform a first band pass filtering with respect to a UWB signal outputted from an LNA, using the first BPF. For example, the UWB communication apparatus may perform the first band pass filtering with respect to the UWB signal, amplified in the first center frequency.

In 803, the UWB communication apparatus may perform a second band pass filtering with respect to a UWB signal outputted from an LNA, using the second BPF. For example, the UWB communication apparatus may perform the second band pass filtering with respect to the UWB signal, amplified in the second center frequency.

In this instance, the first BPF and the second BPF may have a first center frequency and a second center frequency that differ from each other. In one embodiment, the first BPF and the second BPF are substantially identical to the first BPF and the second BPF of FIG. 1.

As such, the UWB signal outputted from the LNA may be converted from an FM signal to an AM signal through the first band pass filtering and the second band pass filtering.

In 804, the UWB communication apparatus may detect a size of a first signal filtered in the first BPF. In particular, the UWB communication apparatus may detect an envelope of the first signal, using a first envelope detector corresponding to the first BPF. For example, the UWB communication apparatus may detect an AM voltage value of the first signal.

In 805, the UWB communication apparatus may detect a size of a second signal filtered in the second BPF. In particular, the UWB communication apparatus may detect an envelope of the second signal, using a second envelope detector corresponding to the second BPF. For example, the UWB communication apparatus may detect an AM voltage value of the second signal.

In 806, the UWB communication apparatus may demodulate a UWB signal, using a difference between the size of the first signal and the size of the second signal detected using the first envelope detector and the second envelope detector, respectively.

As an example, the UWB communication apparatus may calculate the difference between the size of the first signal and the size of the second signal, using a subtractor.

In this instance, the UWB communication apparatus may calculate, using the two BPFs, the difference between the sizes with respect to a UWB signal received during a single period of sweeping. The UWB communication apparatus may demodulate the UWB signal received during the single period of sweeping, based on the difference between the sizes. For example, a UWB signal may be demodulated to a digital signal of "1" or "0".

As such, the difference between the magnitude of the first signal and the magnitude of the second signal may increase as the two BPFs and the subtractor are used. Because of this magnitude increase, an SNR may also increase, and an FM-AM conversion linearity may be enhanced. Accordingly, the UWB communication apparatus may demodulate the UWB signal in a low power.

Although FIG. 8 describes an operation of demodulating a UWB signal using two narrowband BPFs, the descriptions are only exemplary and are not limited thereby. For example, the UWB communication apparatus may demodulate the UWB signal, using at least three narrowband BPFs. Here, redundant descriptions will be omitted because an operation of using the at least three narrowband BPFs is provided able with reference to FIG. 7.

The examples of processing a UWB signal described may facilitate demodulation while minimizing power requirements.

A hardware component may be, for example, a physical device that physically performs one or more operations, but is not limited thereto. Examples of hardware components include microphones, amplifiers, low-pass filters, high-pass filters, band-pass filters, analog-to-digital converters, digital-to-analog converters, and processing devices.

A processing device may be implemented using one or more general-purpose or special-purpose computers, such as, for example, a processor, a controller and an arithmetic logic unit, a digital signal processor, a microcomputer, a field-programmable array, a programmable logic unit, a microprocessor, or any other device capable of running software or executing instructions. The processing device may run an operating system (OS), and may run one or more software applications that operate under the OS. The processing device may access, store, manipulate, process, and create data when running the software or executing the instructions. For simplicity, the singular term "processing device" may be used in the description, but one of ordinary skill in the art will appreciate that a processing device may include multiple processing elements and multiple types of processing elements. For example, a processing device may include one or more processors, or one or more processors and one or more controllers. In addition, different processing configurations are possible, such as parallel processors or multi-core processors.

As a non-exhaustive illustration only, a terminal/device/unit described herein may be a mobile device, such as a cellular phone, a personal digital assistant (PDA), a digital camera, a portable game console, an MP3 player, a portable/personal multimedia player (PMP), a handheld e-book, a portable laptop PC, a global positioning system (GPS) navigation device, a tablet, a sensor, or a stationary device, such as a desktop PC, a high-definition television (HDTV), a DVD player, a Blue-ray player, a set-top box, a home appliance, or any other device known to one of ordinary skill in the art that is capable of wireless communication and/or network communication.

The processes, functions, methods and/or software described above including a UWB communication method may be recorded, stored, or fixed in one or more non-transitory computer-readable storage media that includes program instructions to be implemented by a computer to cause a processor to execute or perform the program instructions. The media may also include, alone or in combination with the program instructions, data files, data structures, and the like. The media and program instructions may be those specially designed and constructed, or they may be of the kind well-known and available to those having skill in the computer software arts. Examples of non-transitory computer-readable media include magnetic media such as hard disks, floppy disks, and magnetic tape; optical media such as CD ROM discs and DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations and methods described above, or vice versa. In addition, a non-transitory computer-readable storage medium may be distributed among computer systems connected through a network and non-transitory computer-readable codes or program instructions may be stored and executed in a decentralized manner.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An apparatus for ultra wideband (UWB) communication, comprising:
   a wideband low noise amplifier (LNA) configured to remove noise included in a received UWB signal, and amplify the UWB signal from which the noise is removed;
   a first band pass filter (BPF) configured to filter the amplified UWB signal to produce a first filtered signal, the first BPF having a first center frequency;
   a second BPF configured to filter the amplified UWB signal to produce a second filtered signal, the second BPF having a second center frequency that differs from the first center frequency; and
   a demodulator configured to demodulate the UWB signal using a magnitude of the first filtered signal and a magnitude of the second filtered signal,
   wherein the magnitude of the first filtered signal is configured to be at a minimum at the second center frequency of the second BPF, and
   wherein the magnitude of the second filtered signal is configured to be at a minimum at the first center frequency of the second BPF.

2. The apparatus of claim 1, wherein the demodulator is configured to increase a signal to noise ratio (SNR) of the UWB signal through increasing a difference between the magnitude of the first filtered signal and the magnitude of the second filtered signal.

3. The apparatus of claim 1, wherein the magnitude of the first filtered signal is configured to be at a maximum at the first center frequency, and the magnitude of the first filtered signal decreases at frequencies that are increasingly distant from the first center frequency, and
   the magnitude of the second filtered signal is configured to be at a maximum at the second center frequency, and the magnitude of the second filtered signal decreases at frequencies that are increasingly distant from the second center frequency.

4. The apparatus of claim 1, wherein the demodulated UWB signal is produced with a greater signal to noise (SNR) ratio than a noisy UWB signal.

5. The apparatus of claim 4, wherein the noisy UWB signal is a frequency modulation (FM) signal and the demodulated UWB signal is an amplitude modulation (AM) signal that corresponds to the noisy UWB signal.

6. The apparatus of claim 1, wherein the first BPF is configured to perform the first band pass filtering operation with respect to an edge signal associated with the first center frequency, and
   the second BPF is configured to perform the second band pass filtering operation with respect to an edge signal associated with the second center frequency.

7. The apparatus of claim 1, wherein the first BPF and the second BPF are configured to perform the first band pass filtering operation and the second band pass filtering operation, respectively, with respect to the UWB signal and configured to convert a frequency modulation (FM) signal to an amplitude modulation (AM) signal.

8. The apparatus of claim 1, the low noise amplifier (LNA), configured to:
   receive a noisy UWB signal, comprising signal information and noise information; and
   process the noisy UWB signal to produce a processed UWB signal, wherein the processed UWB signal comprises amplified signal information and reduced noise information.

9. The apparatus of claim 1, further comprising:
   a first envelope detector configured to detect a magnitude of the first filtered signal;
   a second envelope detector configured to detect a magnitude of the second filtered signal.

10. An apparatus for ultra wideband (UWB) communication, comprising:
    a low noise amplifier (LNA) configured to remove noise included in a UWB signal, and amplify the UWB signal from which the noise is removed;
    band pass filters (BPFs) configured to perform band pass filtering operations based on differing center frequencies with respect to the amplified UWB signal;
    envelope detectors configured to detect magnitudes of filtered signals on which the band pass filtering operations are performed; and
    a demodulator configured to demodulate the UWB signal, using differences detected between the filtered signals,
    wherein the BPFs comprise:
        a first BPF configured to filter the amplified UWB signal to produce a first filtered signal, the first BPF having a first center frequency; and
        a second BPF configured to filter the amplified UWB signal to produce a second filtered signal, the second BPF having a second center frequency that differs from the first center frequency,
    wherein the magnitude of the first filtered signal is configured to be at a minimum at the second center frequency of the second BPF, and
    wherein the magnitude of the second filtered signal is configured to be at a minimum at the first center frequency of the first BPF.

11. The apparatus of claim 10, wherein the demodulator is configured to increase a signal to noise ratio (SNR) of the UWB signal through increasing a magnitude difference between the UWB signals detected.

12. The apparatus of claim 10, wherein the demodulator is configured to calculate a difference between the UWB signals detected, using at least one of a subtractor or an adder.

13. A method for ultra wideband (UWB) communication, comprising:
    removing noise included in a UWB signal, and amplifying the UWB signal from which the noise is removed;
    filtering the amplified UWB signal to produce a first filtered signal, using a first band pass filter (BPF), the first BPF having a first center frequency;
    filtering the amplified UWB signal to produce a second filtered signal, using a second BPF, the second BPF having a second center frequency that differs from the first center frequency; and
    demodulating the UWB signal, using the magnitude of the first filtered signal and the magnitude of the second filtered signal,
    wherein the magnitude of the first filtered signal is configured to be at a minimum at the second center frequency of the second BPF, and
    wherein the magnitude of the second filtered signal is configured to be at a minimum at the first center frequency of the first BPF.

14. The method of claim 13, wherein the demodulating comprises:

increasing a signal to noise ratio (SNR) of the UWB signal through increasing a magnitude difference between the first filtered signal and the second filtered signal.

15. The method of claim 13, wherein the performing of the first filtering comprises:
performing the first filtering with respect to an edge signal associated with a center frequency of the first BPF, and
the performing of the second filtering comprises:
performing the second filtering operation with respect to an edge signal associated with a center frequency of the second BPF.

16. The method of claim 13, further comprising:
detecting a magnitude of the first filtered signal; and
detecting a magnitude of the second filtered signal.

* * * * *